United States Patent

Beidas

(10) Patent No.: US 9,577,588 B1
(45) Date of Patent: Feb. 21, 2017

(54) SYSTEMS AND METHODS FOR SIGNAL PREDISTORTION

(71) Applicant: Hughes Network Systems, LLC, Germantown, MD (US)

(72) Inventor: Bassel F. Beidas, Germantown, MD (US)

(73) Assignee: Hughes Network Systems, LLC, Germantown, MD (US)

( * ) Notice: Subject to any disclaimer, the term of this patent is extended or adjusted under 35 U.S.C. 154(b) by 0 days.

(21) Appl. No.: 14/849,527

(22) Filed: Sep. 9, 2015

(51) Int. Cl.
| | |
|---|---|
| *H04K 1/02* | (2006.01) |
| *H04L 25/03* | (2006.01) |
| *H04L 25/49* | (2006.01) |
| *H03F 1/32* | (2006.01) |
| *H03F 3/21* | (2006.01) |
| *H04B 1/04* | (2006.01) |

(52) U.S. Cl.
CPC ......... *H03F 1/3241* (2013.01); *H03F 1/3258* (2013.01); *H03F 3/211* (2013.01); *H04B 1/0475* (2013.01); *H03F 2201/3203* (2013.01); *H04B 2001/0408* (2013.01)

(58) Field of Classification Search
CPC ...... H03F 1/3241; H03F 1/3258; H03F 3/211; H03F 2201/3203; H04B 1/0475; H04B 2001/0408; H04L 27/367
USPC ....... 375/296, 297, 298; 455/114.3; 330/149
See application file for complete search history.

(56) References Cited

U.S. PATENT DOCUMENTS

| | | | | |
|---|---|---|---|---|
| 2004/0130394 | A1* | 7/2004 | Mattsson | H03F 1/3241 330/149 |
| 2012/0281777 | A1* | 11/2012 | Ho | H03F 1/3247 375/267 |
| 2016/0006597 | A1* | 1/2016 | Simoens | H04L 27/367 375/296 |

FOREIGN PATENT DOCUMENTS

EP 1374517 A2 1/2004

OTHER PUBLICATIONS

Beidas, Bassel F. et al., Multicarrier Successive Predistortion for Nonlinear Satellite Systems, IEEE Transactions on Communications, Apr. 1, 2015, pp. 1373-1382, vol. 63—issue 4, IEEE Service Center, Piscataway, NJ, USA.
European Patent Office, International Search Report for PCT/US2016/050805, Dec. 7, 2016, pp. 1-6.

* cited by examiner

*Primary Examiner* — Phuong Phu
(74) *Attorney, Agent, or Firm* — Sheppard Mullin Richter & Hampton LLP

(57) ABSTRACT

A single or multistage signal predistorter includes an input coupled to receive an information signal comprising input samples and an output coupled to the high power amplifier, the signal predistorter configured to receive an input sample, generate a distortion sample based on an estimate of nonlinearity of the high power amplifier at an operating saturation level, modify the input sample with a correction term to generate a predistortion signal, wherein the correction term is proportional to the distortion sample, and further wherein the predistortion signal comprises the information signal modified to account for nonlinearities in the high power amplifier.

38 Claims, 12 Drawing Sheets

SYSTEMS AND METHODS FOR SIGNAL PREDISTORTION

TECHNICAL FIELD

The disclosed technology relates generally to communication systems, and more particularly, some embodiments relate to systems and methods for performing signal predistortion.

DESCRIPTION OF THE RELATED ART

A goal of communication system designers is to increase power efficiency in digital communication systems. One conventional technique for increasing efficiency is to operate High Power Amplifiers (HPAs) close to saturation. Examples of these systems are narrowband systems such as those used on the return link in satellite communications systems, or wideband systems such as those employing code-division multiple access (CDMA), orthogonal frequency-division multiple access (FDMA), or multicarrier systems. However, a downside to increasing power efficiency in this way is spectral regrowth caused by operating the HPA close to saturation. Spectral regrowth is energy from the modulated signal that spreads into adjacent channels due to the amplifier's inherent nonlinearities. This spectral regrowth can cause adjacent channel interference (ACI), and potentially violates out-of-band emission requirements set by regulatory commissions. Furthermore, this can also cause in-band distortion, manifested as clustering in a scatter plot at the receiver and quantified by mean-square error (MSE) relative to nominal constellation. Both effects can severely degrade performance if left unmitigated.

Accordingly, to avoid or reduce the effects of such issues, designers typically back-off or limit the output power from the maximum level to operate more in the linear range. Other solutions have employed predistortion as a signal processing technique to compensate for nonlinearities in the power amplifier at the transmitter. One conventional approach applies the inverse of the HPA in a single stage in an attempt to undo the effects of the HPA. Another conventional solution is to sample at the symbol rate and modify transmitted symbols, however this generally can only correct for in-band distortion and cannot compensate for spectral regrowth. In fact data predistortion operating at the symbol rate may contribute to spectral regrowth after the HPA. Other conventional predistortion methods require special transmit and receive filters which is not desirable in practical systems.

BRIEF SUMMARY OF EMBODIMENTS

Embodiments of the systems and methods disclosed herein provide an innovative form of signal predistortion to suppress, in some cases significantly, the spectral regrowth as well as in-band distortion simultaneously. This may be done in some embodiments while keeping the HPA operating efficiently near saturation. As a result of the suppression of spectral regrowth, the technology disclosed herein can also allow closer spacing of adjacent carriers in the frequency domain, which can result in higher levels of spectral efficiency.

The system can be configured to employ successive predistortion and can be further configured to operate at the signal level, or at multiple samples per symbol. Embodiments of the disclosed technology can further include an adjustable memory span that can be selected to account for memory effects associated with the HPA. In some embodiments, it can be memoryless, which is adequate for memoryless HPAs or for conditions in which the symbol rate is much smaller than the bandwidth of the HPA. Other embodiments can be configured to deliberately introduce memory to further suppress mean-square error (MSE) and provide a tuning feature to balance levels of suppressing spectral regrowth versus in-band distortion, measured in terms of ACI and MSE in decibels (dBs). In some embodiments, significant gains can be achieved as compared with systems that do not use the disclosed predistortion techniques. Additionally, embodiments can be implemented allowing tuning the system to trade-off levels of spectral growth suppression and in-band distortion.

Because configurations can be implemented to reduce spectral regrowth and in band distortion, excellent system performance can be achieved while maintaining high efficiency in both power and bandwidth resources. In various embodiments, the signal predistortion is provided at the transmitter, prior to the HPA, to mitigate the unwanted nonlinear effects caused by operating the HPA at or near saturation.

According to various embodiments of the disclosed technology a communication system having one or more channels. The channel, or in the case of a multichannel or multicarrier system each addressed channel, may include a corresponding signal input, includes for each channel: a high power amplifier including an input and an output; and a single or multistage signal predistorter including an input coupled to receive an information signal including input samples and an output coupled to the high power amplifier, the signal predistorter configured to receive an input sample, generate a distortion sample based on an estimate of nonlinearity of the high power amplifier at an operating saturation level, modify the input sample with a correction term to generate a predistortion signal, wherein the correction term is proportional to the distortion sample, and further wherein the predistortion signal comprises the information signal modified to account for nonlinearities in the high power amplifier.

For a first stage of a multistage signal predistorter, the input sample includes the input samples prior to amplification by the high power amplifier and the predistortion signal is a first predistortion signal output by the first stage. For each $s^{th}$ stage of the multistage signal predistorter after the first stage, the input to this stage is the signal generated by the $(s-1)^{th}$ stage of the multistage signal predistorter.

The communication system in some embodiments further include a second single or multistage signal predistorter to account for nonlinearities caused by the power amplifier as experienced by a receiver in communication with the transmitter, the second signal predistorter including an input coupled to receive a received information signal and an output, the second multistage signal predistorter configured to receive a received sample from the received information signal, generate a receiver distortion sample based on an estimate of nonlinearity of the receiver, modify the received sample with a second correction term to generate a receiver predistortion signal, wherein the second correction term is proportional to the receiver distortion sample, and further wherein the receiver predistortion signal includes the received information signal modified to account for nonlinearities in the receiver. In some embodiments, the first and second signal predistorters are applied in the communication system as a weighted combination.

In some embodiments, a single or multistage signal predistorter includes an input coupled to receive an input sample; a nonlinear estimator configured to estimate a nonlinearity of the high power amplifier at an operating saturation level; a plurality of stages, each $s^{th}$ stage including: a first adder configured to subtract the determined estimate from an input information signal at the $s^{th}$ stage to generate an $s^{th}$ distortion sample; a multiplier configured to multiply the $s^{th}$ distortion sample by an $s^{th}$ convergence factor to generate an $s^{th}$ correction term; a second adder configured to add the $s^{th}$ correction term to the input information signal at the $s^{th}$ stage to generate an $s^{th}$ predistortion signal; and an output coupled to the high power amplifier and configured to output the $s^{th}$ predistortion signal from the last stage of the plurality of stages.

For a first stage of a multistage signal predistorter, the input information signal includes an undistorted information signal, and for each $s^{th}$ stage of the multistage signal predistorter after the first stage, the input information signal includes the predistortion signal generated by the $(s-1)^{th}$ stage of the multistage signal predistorter.

Other features and aspects of the disclosed technology will become apparent from the following detailed description, taken in conjunction with the accompanying drawings, which illustrate, by way of example, the features in accordance with embodiments of the disclosed technology. The summary is not intended to limit the scope of any inventions described herein, which are defined solely by the claims attached hereto.

BRIEF DESCRIPTION OF THE DRAWINGS

The technology disclosed herein, in accordance with one or more various embodiments, is described in detail with reference to the following figures. The drawings are provided for purposes of illustration only and merely depict typical or example embodiments of the disclosed technology. These drawings are provided to facilitate the reader's understanding of the disclosed technology and shall not be considered limiting of the breadth, scope, or applicability thereof. It should be noted that for clarity and ease of illustration these drawings are not necessarily made to scale.

The figures are not intended to be exhaustive or to limit the invention to the precise form disclosed. It should be understood that the invention can be practiced with modification and alteration, and that the disclosed technology be limited only by the claims and the equivalents thereof.

DETAILED DESCRIPTION OF THE EMBODIMENTS

Embodiments of the technology disclosed herein is directed toward a devices and methods for providing signal predistortion to suppress spectral regrowth and limit in-band distortion in communication systems. More particularly, some embodiments of the technology disclosed herein provide successive predistortion for RF communication systems that can operate at the signal level (e.g., at multiple samples per symbol) to suppress spectral regrowth while simultaneously limiting in-band distortion, while operating at or near saturation of the HPA.

Figure 1:
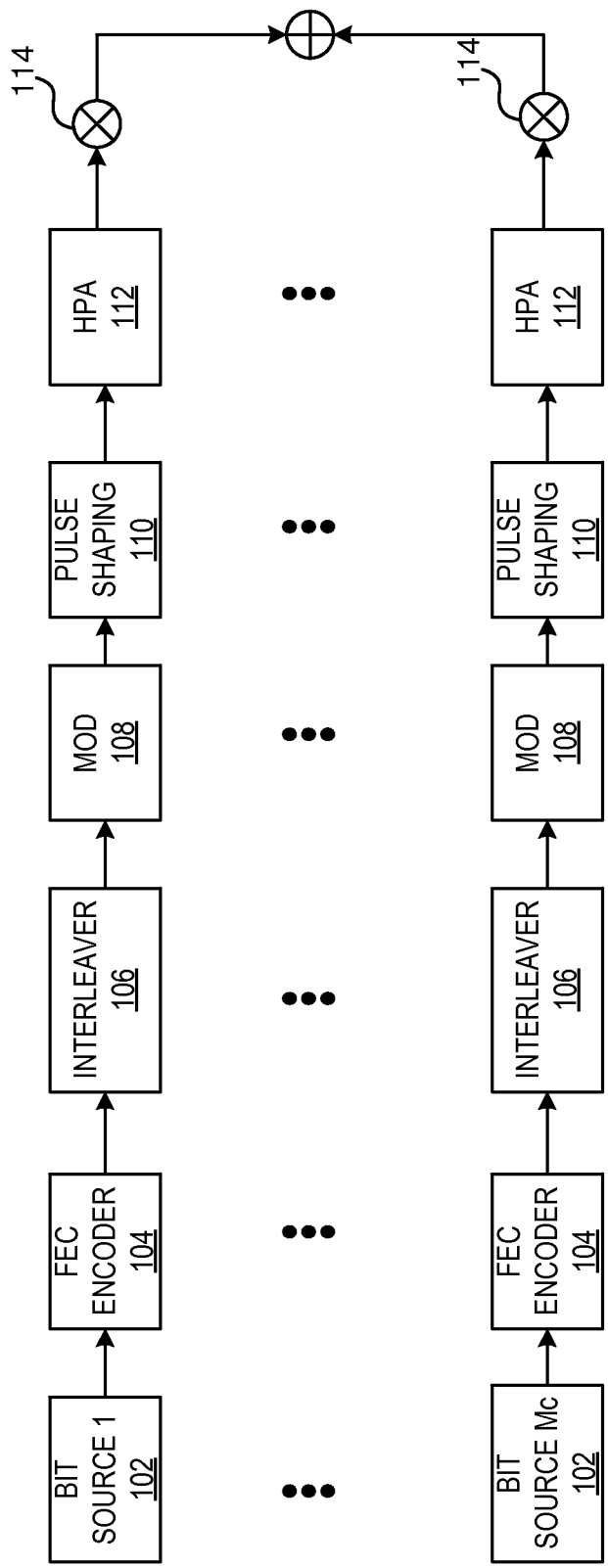
FIG. 1 illustrates an example communication transmitter in accordance with one embodiment of the technology described herein.

Before describing the technology in further detail, it is useful to describe an example communication system with which the disclosed technology can be implemented. One such example is a multicarrier communication transmitter such as, for example, a transmitter included in a satellite communication transceiver. FIG. 1 illustrates an example communication transmitter. With reference now to FIG. 1, it is assumed that there are Mc independent carriers for transmitting binary data. This example communication transmitter includes, for each carrier, a bit source 102, a forward error correction (FEC) encoder 104, an interleaver 106, a modulator 108, a transmit filter 110, an HPA 112 and a mixer 114. Although these components are shown in a particular order in this example, one of ordinary skill in the art reading this description will understand that the order of components can be varied (e.g., in some cases the HPA may be included after the mixer to amplify the mixed signal, etc.) and some components may be excluded. One of ordinary skill in the art will understand how other transmitter configurations can be implemented, and that one or more of these components can be implemented in either digital form (e.g., as software running on a DSP or other processing device, with the addition of a DAC) or as analog components.

Bit source 102 provides information bits to be transmitted to FEC encoder 104. The information can include, for example, images, video, audio, information and other data. FEC encoder 104 provides forward error correction by adding redundancy to information data bits signal 152. Forward error correction improves the capacity of a channel by adding redundant information to the data being transmitted through the channel.

Interleaver 106 is scrambles the encoded data bits by rearranging the bit sequence order to make distortion at the receiver more independent from bit to bit. In other words, interleaver 106 rearranges the ordering of the data sequence in a one to one deterministic format. Interleaving may be used to enhance the error correcting capability of coding.

Modulator 108 modulates the interleaved bits to form complex-valued data symbols. Examples of modulation include Amplitude Phase Shift Keying (APSK), Quadrature Phase Shift Keying (QPSK), n/M-MPSK, other orders of Multiple Phase Shift Keying MPSK, Quadrature Amplitude Modulation (QAM), and so on.

Pulse shaping filter 110 converts complex-valued data symbols to a waveform signal using a pulse shaping function with an impulse response p(t). High Power Amplifier (HPA) 112 amplifies the waveform for transmission. As discussed herein, embodiments of the signal predistortion can be implemented such that the HPA can be driven at or near saturation, with little or no backoff.

Mixer 114 mixes the waveform signal 160 with a carrier signal from a local oscillator (not shown) to modulate it onto an appropriate carrier for transmission. For a given transmitting source, the local oscillator signal may be represented as a function of $e^{i(2\pi f_x t)}$, where $f_x$ is the carrier for the respective source, $f_1 \ldots f_{Mc}$. Adder 116 adds output signals from the plurality of transmitting sources to provide a composite signal.

Having thus described an example application, the technology disclosed herein may from time to time be described herein in terms of this example application. Description in terms of this environment is provided to allow the various features and embodiments of the invention to be portrayed in the context of an exemplary application. After reading this description, it will become apparent to one of ordinary skill in the art how the invention can be implemented in different and alternative environments and applications. By way of example, one of ordinary skill in the art will understand how the technology disclosed herein can also be implemented in a single-channel system.

Figure 2:
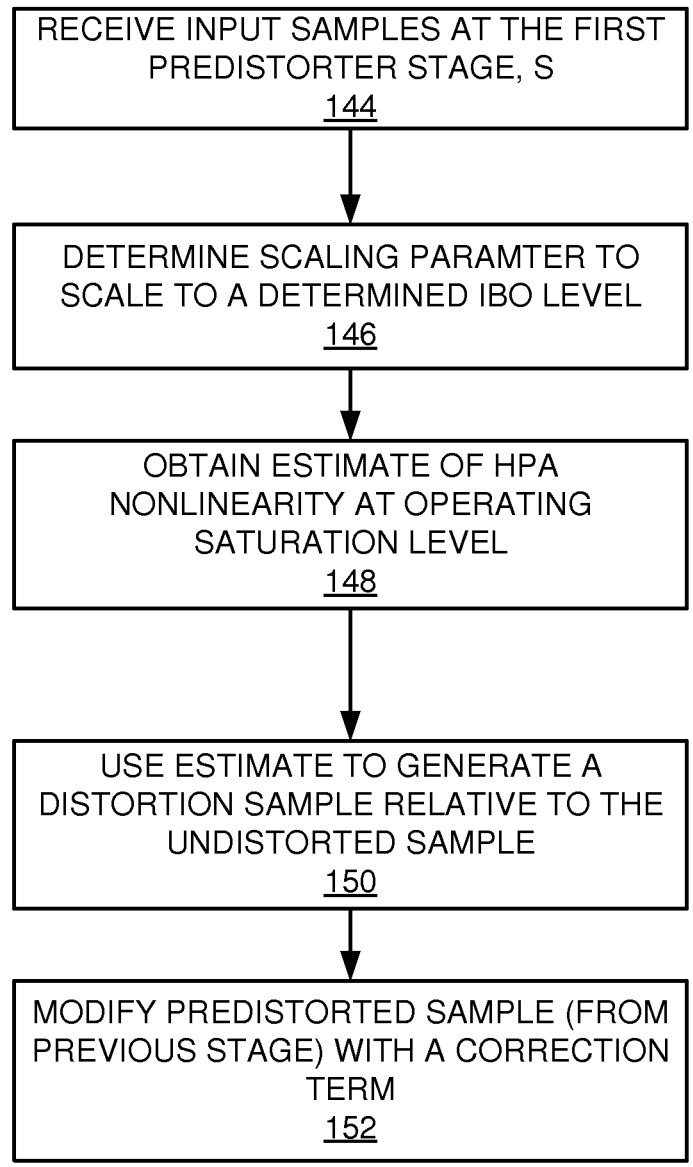
FIG. 2 is an operational flow diagram illustrating an example process for signal predistortion in accordance with one embodiment of the technology described herein.

As noted above, in various embodiments the signal predistortion described herein can be implemented to cancel distortion in one or more stages and to operate at the sample (as opposed to symbol) level. Before describing a few more specific example embodiments, the technique is more generally described. FIG. 2 is an operational flow diagram illustrating an example process for signal predistortion in accordance with one embodiment of the technology described herein. With reference to FIG. 2, at operation 144 input samples are received at the predistorter. For example, the input of the predistorter can be a vector of complex-valued samples at the each stage. For the first stage or application of signal predistortion, the input signal is not predistorted by a prior stage and the input is therefore composed of undistorted input samples.

At operation 146, a scaling parameter is determined. In other embodiments, the scaling parameter is a real-valued scaling parameter that can be included and used to scale to the correct input back-off (IBO) level. The scaling parameter can be chosen based on the operating point of the amplifier, and can be determined based on the desired operating range of the HPA. It can be chosen, for example, to provide a determined balance between power loss and distortion. In some embodiments, it can be modeled in advance based on known operating characteristics of the amplifier.

At operation 148, the operating characteristics of the HPA operating at a determined level of saturation (which may be, for example, at or near saturation) are determined and a distorted sample estimate at the HPA output is determined. The distorted sample estimate can be based on modeled HPA characteristics for static cases in some embodiments, while in other embodiments it can be adaptively estimated. Adaptive estimation can be performed, for example, using standard estimation techniques such as, for example, stochastic gradient methods, which can track slowly-varying effects due to ageing and temperature variations experienced by the HPA. Accordingly, a model of the specified HPA can be generated based on known amplifier characteristics, such as its nonlinearity at high saturation levels.

At operation 150, a distortion sample is generated based on the determined estimate. At operation 152, the predistortion output is generated. This can be accomplished, for example by modifying the predistorted sample from the previous stage (for stages other than stage 1) with a correction term. The correction term applied may be proportional to the distortion sample. In some embodiments, the correction term may be the distortion sample multiplied by a sequence factor to provide convergence in successive stages. The process can be repeated for multiple stages where the input for a given stage is the predistorted sample from the previous stage.

A few example embodiments of the above-described process are now provided. The first example embodiment cancels distortion at the HPA output and can provide control in suppressing the spectral regrowth typically encountered when operating the HPA efficiently. It also provides benefit in reducing mean-square error (MSE) at the receiver. In this embodiment, let the input to of the predistorter, $x_{PD}^{(s)}[k;L]$, be the vector of complex-valued samples at the s-th stage. This input can be given by $$x_{PD}^{(s)}[k;L] = \begin{bmatrix} x_{PD}^{(s)}[k] \\ x_{PD}^{(s)}[k-1] \\ \vdots \\ x_{PD}^{(s)}[k-L] \end{bmatrix}$$

where the parameter L is the double-sided memory span of the predistorter and s=0, 1, . . . , S−1.

For the first stage or application of signal predistortion, the input signal is input samples undistorted by a prior stage and the input is therefore composed of undistorted samples. In this special case, the input is given by:

$$x_{PD}^{(0)}[k;L] = \begin{bmatrix} x[k] \\ x[k-1] \\ \vdots \\ x[k-L] \end{bmatrix}.$$

The distorted sample at the HPA output is estimated. This estimation can be performed, for example, based on known operating characteristics of the specified HPA when it is operating at or near saturation. A sample $\hat{x}_{PA}[k]$ can be defined as the estimate of the distorted sample at the HPA output or $$\hat{x}_{PA}[k]=f_{NL}(\underline{x}_{PD}^{(s)}[k;L]/\gamma_{IBO})$$

where $f_{NL}(\cdot)$ represents the nonlinearity of the HPA at a given level of saturation, and $\gamma_{IBO}$ is a real-valued scaling parameter that can be included and used to scale to the correct input back-off (IBO) level. In practical application, and depending on the signal input, it may not be possible to completely eliminate the need for some input backoff. However, successive applications may allow the system designer to get as close to the saturation point as possible while avoiding unwanted levels of spectral regrowth.

In some embodiments, the function $f_{NL}(\cdot)$ can be an estimate of the nonlinearity of the HPA. The function $f_{NL}(\cdot)$ can use the modeled HPA characteristics for static cases, or it can be adaptively estimated using standard estimation techniques such as stochastic gradient methods, to track slowly-varying effects due to ageing and temperature variations experienced by the HPA. Accordingly, $f_{NL}(\cdot)$ can be thought of as a model of the specified HPA that can be generated based on known amplifier characteristics, such as its nonlinearity at high saturation levels. In various embodiments, $f_{NL}(\cdot)$ can be approximated using, for example, polynomial approximation and can therefore be developed and trained off-line.

The scaling parameter can be used to match the operating point of the amplifier. The scaling parameter can be determined based on where the system designer desires to operate the HPA. It can be chosen, for example, to provide the best balance between power loss and distortion, and it can be modeled in advance based on known operating characteristics of the amplifier.

In the various stages, the determined estimate $\hat{x}_{PA}[k]$ may be utilized to generate a distortion sample $e_{PA}[k]$ relative to the undistorted sample. For example, in one embodiment, the estimate of the distortion introduced by the HPA can be subtracted out from the input signal to the HPA by the predistorter such that when the HPA distorts incoming signal that actually returns the incoming signal to, or closer to, its original form. Accordingly, distortion sample $e_{PA}[k]$ can be given by:

$$e_{PA}[k]=x[k]=x[k]-\hat{x}_{PA}[k]$$

As noted above, various embodiments use a successive application of the predistortion to drive the distortion sample $e_{PA}[k]$ toward zero. For this, the predistortion output is generated by modifying the predistorted sample from the previous stage with a correction term that is proportional to the distortion sample. More particularly, the output of the predistorter at the s-th stage, $x_{PD}^{(s+1)}[k]$, is mathematically expressed as $$x_{PD}^{(s+1)}[k]=x_{PD}^{(s)}[k]+\mu_1^{(s)}\cdot e_{PA}[k]$$

where $\mu_1^{(s)}$ is a step-size sequence satisfying certain conditions, including being positive and decreasing, to ensure progress toward a solution.

The factor, $\mu$, can be adjusted to control the speed of convergence. This factor can be determined and optimized using simulation techniques. In various embodiments, the $\mu$ factor is a positive value decreasing with each successive stage.

The greater the convergence factor, $\mu$, the quicker the solution converges. However, if the factor is not decreased in successive stages the system may overcompensate. Accordingly, the convergence factor starts at a large value for quicker convergence and as stages progress it gets increasingly smaller.

Figure 3:
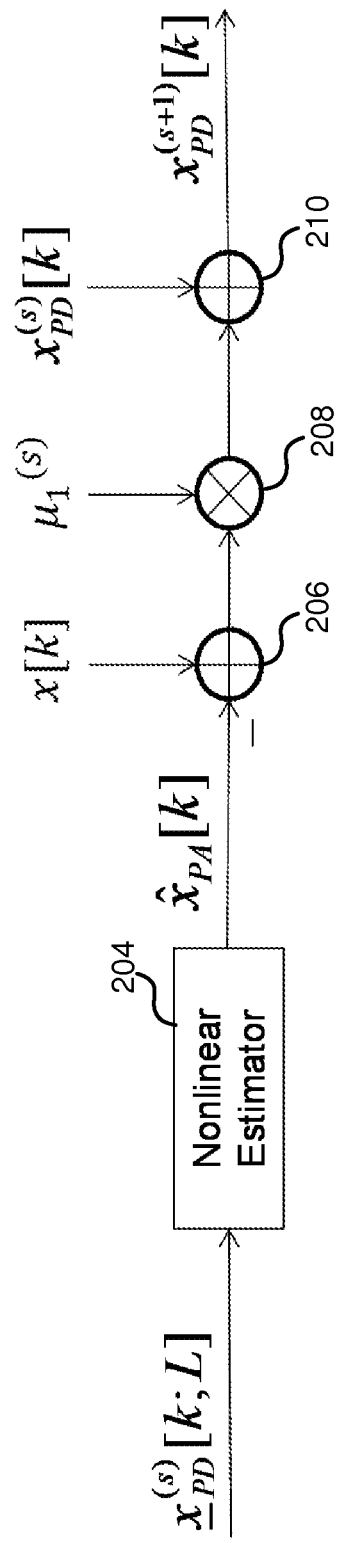
FIG. 3 is a block diagram displaying an example implementation of an embodiment of an $s^{th}$ stage of a signal predistorter.

FIG. 3 is a block diagram displaying an example implementation of this embodiment of the s-th stage of the signal predistorter. With reference now to FIG. 3, in this example the vector of complex-valued samples at the s-th stage, $x_{PD}^{(s)}[k;L]$, is input to a nonlinear estimator 204. The subscript 'PD' indicates that these are pre-distorted symbols being input into nonlinear estimator 204 at this stage. The superscript '(s)' indicates the number of the stage.

In this example, non-linear estimator estimates the effect of the HPA on the input signal and outputs that estimation as $\hat{x}_{PA}[k]$. Adder 206 determines the difference between this output estimate and the input signal x[k], to determine the distortion sample, $e_{PA}[k]=x[k]-\hat{x}_{PA}[k]$.

The distortion sample is multiplied by the scaling factor $\mu_1^{(s)}$ at signal multiplier 208. $\mu_1^{(s)}\cdot e_{PA}[k]$. This is then added to the pre-distorted sample for that stage in adder 210, resulting in the pre-distorted sample for the next stage, (s+1): $x_{PD}^{(s+1)}[k]=x_{PD}^{(s)}[k]+\mu_1^{(s)}\cdot e_{PA}[k]$.

As noted above, L represents the memory span of the predistorter. In various applications, the high power amplifier can be memoryless or it can have a memory. Therefore, the memory span of the predistortion can be as large as the memory of the amplifier with which it is implemented. In various embodiments, predistortion can be implemented with an adjustable memory span L.

Figure 4:
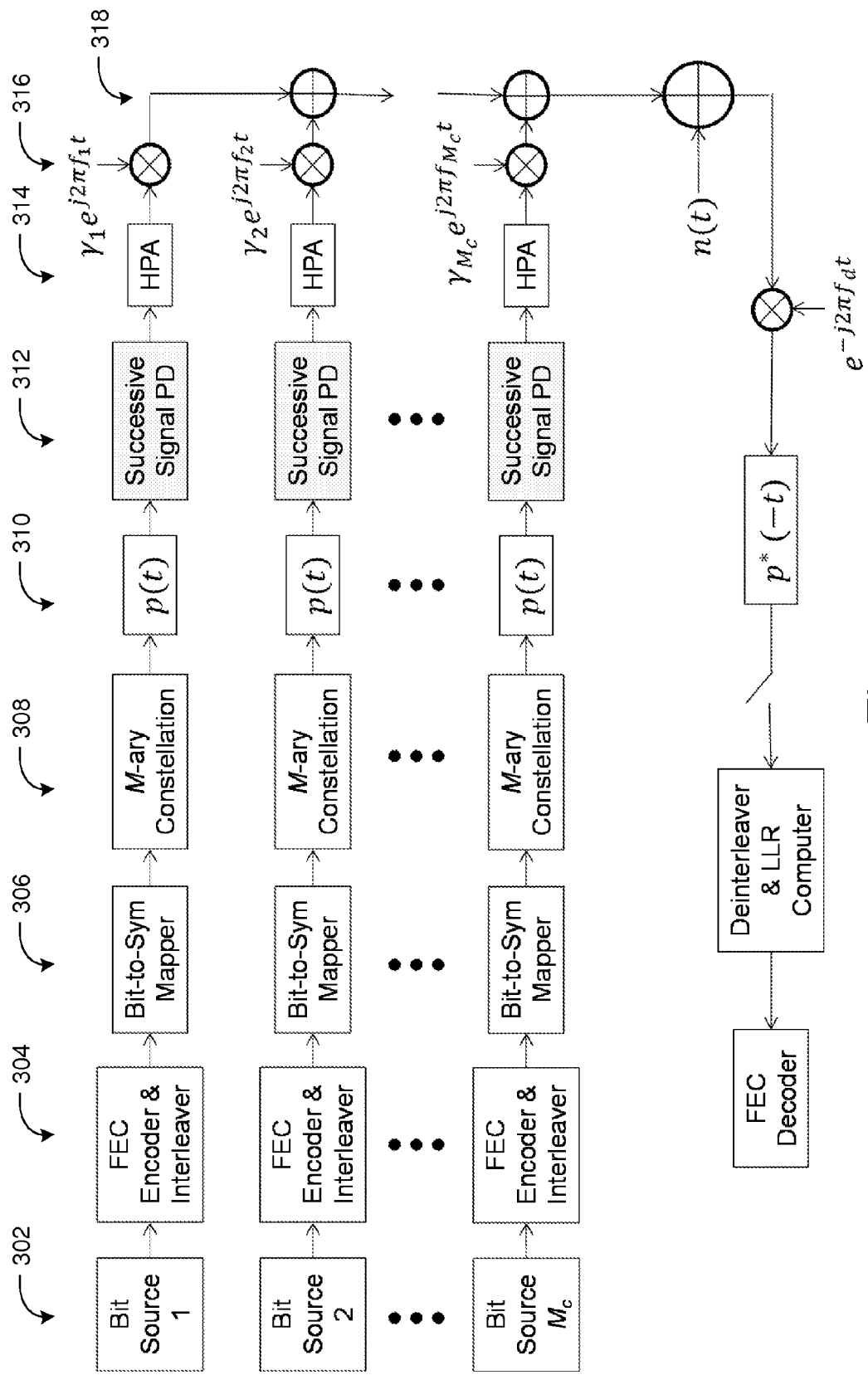
FIG. 4 is a diagram illustrating an example signal model for implementing signal predistortion at a HPA in accordance with one embodiment of the technology described herein.

FIG. 4 is a diagram illustrating an example signal model for implementing signal predistortion at the HPA in accordance with one embodiment of the technology described herein. Although the systems and methods disclosed herein can be implemented in a single-channel system, the example illustrated in FIG. 4 is a multicarrier communication system having Mc carriers. Each carrier includes a bit source 302, an FEC encoder/interlever 304, a bit-to-symbol mapper 306, a pulse shaper 310, a successive signal predistorter 312 and HPA 314 and a mixer 316. The adders 318 represent the communication channel which can introduce noise, n(t), into the system.

In operation, data received at bit source 302 can be encoded using forward error correction (FEC) coding for error control purposes. Bit-to-symbol mapper 306 maps the incoming bits to samples in a constellation to create the M-ary constellation of samples 308. Pulse shaper 310, also referred to as a pulse shaping filter, transfers the resultant waveform for transmission by limiting its effective bandwidth.

Signal pre-distort or 312 applies predistortion, such as that described above, to the signal before it is supplied to the HPA 314. Because of the predistortion, HPA 314 can be configured to operate at or near saturation to amplify the wave form for transmission across the communication channel.

At the receiver, the received signal is down converted at mixer 322, applied it to a conjugate pulse shaper 324, and sampled by sampler 326. The inter-lever 328 and FEC decoder 330 reproduce estimates of the transmitted data.

A second example embodiment is now described. While the above example focuses on spectral regrowth and may be applied at the HPA, this example focuses on in-band distortion (IBD). Particularly, this example embodiment may use a model of the receive filter, which has a band limited output. Because the receive filter filters out the effects spectral regrowth, there is little or no need to address this component of distortion at this point in the communication system.

This example embodiment can be used to cancel in-band distortion experienced at the receive filter output and suppress MSE at the receiver, as manifested by clustering in a scatter plot typically encountered when operating the HPA at or near saturation. This example embodiment is now described.

As in the first embodiment, the input to the second embodiment of the predistorter can be given by $\underline{x}_{PD}^{(s)}[k;L]$, which in one example is a vector of complex-valued samples at the s-th stage:

$$x_{PD}^{(s)}[k;L] = \begin{bmatrix} x_{PD}^{(s)}[k] \\ x_{PD}^{(s)}[k-1] \\ \vdots \\ x_{PD}^{(s)}[k-L] \end{bmatrix}$$

where the parameter L is the double-sided memory span of the predistorter and s=0, 1, ..., S−1. In some applications, the vector can be collapsed into a sample. A special case of the above is the first application of the predistortion for which the input is composed of the undistorted samples or $$x_{PD}^{(0)}[k;L] = \begin{bmatrix} x[k] \\ x[k-1] \\ \vdots \\ x[k-L] \end{bmatrix}.$$

The sample $\hat{x}_{RCVR}[k]$ at the output of the receive filter can be estimated. This estimate of the distorted sample at the receive filter output can be stated as:

$$\hat{x}_{RCVR}[k] = g_{NL}(\underline{x}_{PD}^{(s)}[k;L];\gamma_{IBO})$$

where $g_{NL}(\bullet)$ represents the nonlinear system, including the receive filter, and $\gamma_{IBO}$ is a real-valued parameter used to scale to the correct IBO level.

The estimate $\hat{x}_{RCVR}[k]$ may be utilized to generate a receiver distortion sample $e_{RCVR}[k]$ relative to the sample as it would appear at the receive filter output without distortion, $x_{RCVR,Ideal}[k]$ or $$e_{RCVR}[k] = x_{RCVR,Ideal}[k] - \hat{x}_{RCVR}[k]$$

Successive application of the predistortion is then used to drive the distortion sample $e_{RCVR}[k]$ toward zero. For this, the predistortion output is generated by modifying the predistorted sample from the previous stage with a correction term that is proportional to the distortion sample. Namely, the output of the predistorter at the s-th stage, $x_{PD}^{(s+1)}[k]$, is mathematically expressed as $$x_{PD}^{(s+1)}[k] = x_{PD}^{(s)}[k] + \mu_2^{(s)} \cdot e_{RCVR}[k]$$

where $\mu_2^{(s)}$ is a step-size sequence satisfying certain conditions, including being positive and decreasing, to ensure progress toward a solution.

The third example embodiment combines predistortion to compensate for the HPA with predistortion to compensate for the receive filter to allow scaling of the two error signals relative to each other. The compensation applied to cancel distortion at the HPA or the receive filter can be weighted to adjust the amount of predistortion applied for each source of distortion.

The output of this combined predistorter at the s-th stage, $x_{PD}^{(s+1)}[k]$, allows a weighted combination of the HPA predistortion signal correction and the receiver predistortion correction, such that two adjustments are made. This may be mathematically expressed as $$x_{PD}^{(s+1)}[k] = x_{PD}^{(s)}[k] + (\alpha \cdot \mu_1^{(s)} \cdot e_{PA}[k] + \beta \cdot \mu_2^{(s)} \cdot e_{RCVR}[k])$$

which shows HPA predistortion, $\mu_1^{(s)} \cdot e_{PA}[k]$, weighted by $\alpha$, and receiver predistortion, $\mu_2^{(s)} \cdot e_{RCVR}[k]$, weighted by $\beta$. In various embodiments, $\alpha,\beta$ are positive parameters that can be included for tunability to scale one factor relative to the other, and $\mu_1^{(s)}$, $\mu_2^{(s)}$ are step-size sequences satisfying certain conditions, including being positive and decreasing, to ensure convergence toward a solution. Note that in this example, a weighted sum is taken of the distortion samples at the HPA output $e_{PA}[k]$ and the distortion sample at the receive filter output $e_{RCVR}[k]$, defined previously. Successive application of the predistortion here is used to drive the weighted sum of the distortion samples toward zero.

The memory span of the predistorter, or parameter L above, may be selected by the designer to achieve good performance while meeting computational complexity requirements. The memory of the first embodiment is dictated by the memory of the HPA. For narrowband applications, typical of satellite return link communications, the HPA is memoryless, so it would be sufficient to use memoryless successive predistorter, or L=0. For wider bandwidth applications, such as wideband CDMA or wideband OFDM or multicarrier communications, HPA memory effect needs to be taken into consideration. Selecting L to match the memory span of the HPA provides good performance. Using memoryless predistortion for HPA with memory yields degraded performance. Moreover, the second and third example embodiments disclosed above introduce more memory into the predistortion to further suppress in-band distortion and provide significant tuning capability to balance levels of ACI and MSE.

Results achieved by embodiments of the systems and methods disclosed herein have been modeled by simulation, and those results are now described. The simulations were configured using a simulation set up as depicted in FIG. 4, which as described above includes up to $M_c$ data sources that transmit information bits through binary encoders. Code bits are interleaved and processed through bit-to-symbol mapping 306 onto the signal constellation 308. A transmit filter p(t) 310 is used to provide bandwidth-efficient pulse shaping. At its output, the proposed successive signal predistorter 312 is placed, followed by the HPA 314. Each HPA output is frequency translated to its respective frequency slot by mixers 316. For simulation, Additive White Gaussian Noise (AWGN) n(t) is added to the sum of the frequency-translated outputs of the HPA devices. The noisy signal is then translated in frequency back to baseband and is processed by the receive filter which forms a matched pair with the transmit pulse, or p*(−t). This matched filter rejects noise in non-signal band. The sampled output is used to generate log-likelihood ratios (LLR) for the FEC decoders.

As an example, in the simulation, a root-raised cosine (RRC) with a rolloff factor of 0.25 is used for pulse shaping, and 16-ary Amplitude and Phase Shift Keying (APSK) constellation is employed. Also, the HPA used in the testing is considered to be memoryless that introduces amplitude and phase distortions in terms of amplitude modulation (AM)/AM and AM/phase modulation (PM) conversions that can be modeled. The placement of transmit and receive filters before and after the memoryless HPA introduces nonlinear distortion with memory.

Figure 5:
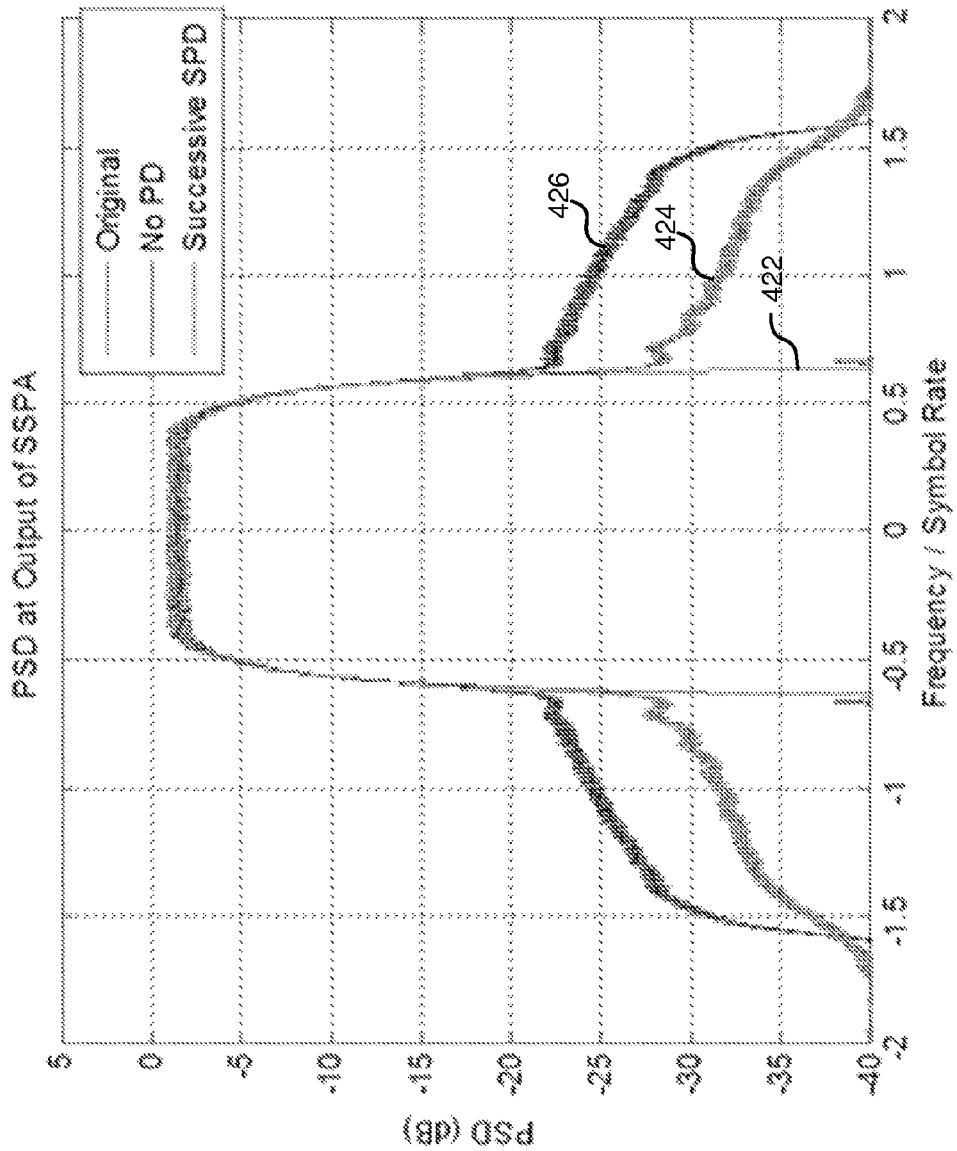
FIG. 5 is a diagram illustrating Power Spectral Density (PSD) for an original signal 422 without distortion, for an amplified signal without signal predistortion, and for the amplified signal with signal predistortion at the HPA output when operated at OBO level of 1.5 dB in accordance with one embodiment of the technology described herein.

Results are reported at various levels of output back-off (OBO), which is defined as the loss in power, relative to saturation, of the modulated signal and is measured at the HPA output. FIG. 5 shows the Power Spectral Density (PSD) for the original signal 422 without distortion, for the amplified signal 426 without signal predistortion, for the amplified signal 424 with signal predistortion at the HPA output when operated at OBO level of 1.5 dB. This simulation illustrates the suppression of spectral regrowth due to nonlinear distortion by an amount that exceeds 8 dB as a result of signal predistortion.

Figure 6:
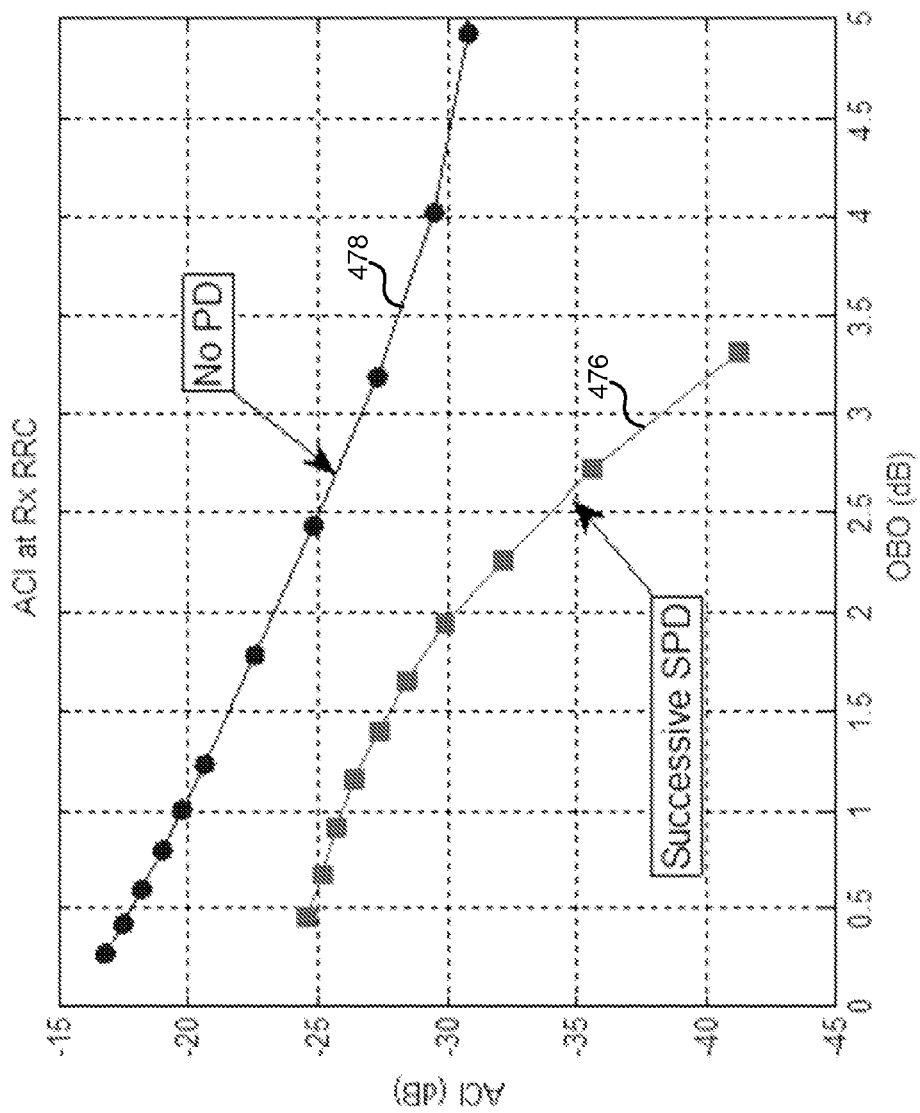
FIG. 6 shows Adjacent Channel Interference (ACI) with and without signal predistortion at the receive filter output for varying levels of OBO.

FIG. 6 shows Adjacent Channel Interference (ACI) with and without signal predistortion at the receive filter output for varying levels of OBO. For these measurements, adjacent carrier spacing of 1.25× symbol rate is used. This illustrates levels of ACI with successive signal predistortion 476 as compared with the levels of ACI without predistortion 478. As this illustrates, the levels of ACI are drastically reduced by embodiments of the disclosed techniques, indicating the ability to suppress the spectral regrowth or out-of-band emission due to nonlinear distortion, while keeping the HPA operating efficiently at the same, or about the same, OBO level.

Figure 7:
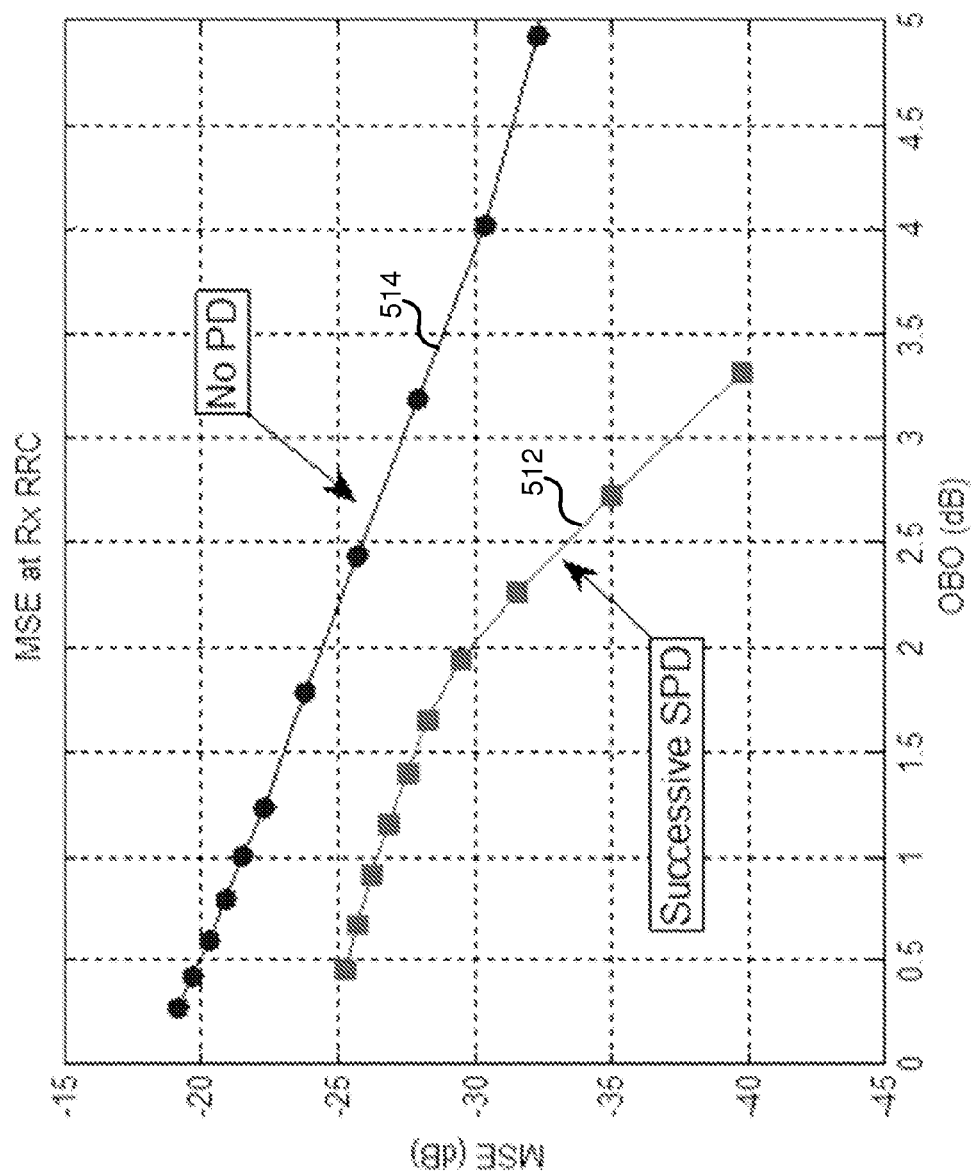
FIG. 7 shows the mean-square error (MSE) at the best-sampled output of the receive filter with embodiments of the disclosed signal predistortion and without signal predistortion.

FIG. 7 shows the mean-square error (MSE) at the best-sampled output of the receive filter with embodiments of the disclosed successive signal predistortion 512 and without signal predistortion 514. As can be seen from the results of this simulation, the proposed signal predistortion effectively mitigates in-band distortion due to the nonlinear HPA behavior, while keeping the HPA operating efficiently at or near the same OBO level.

Figure 8:
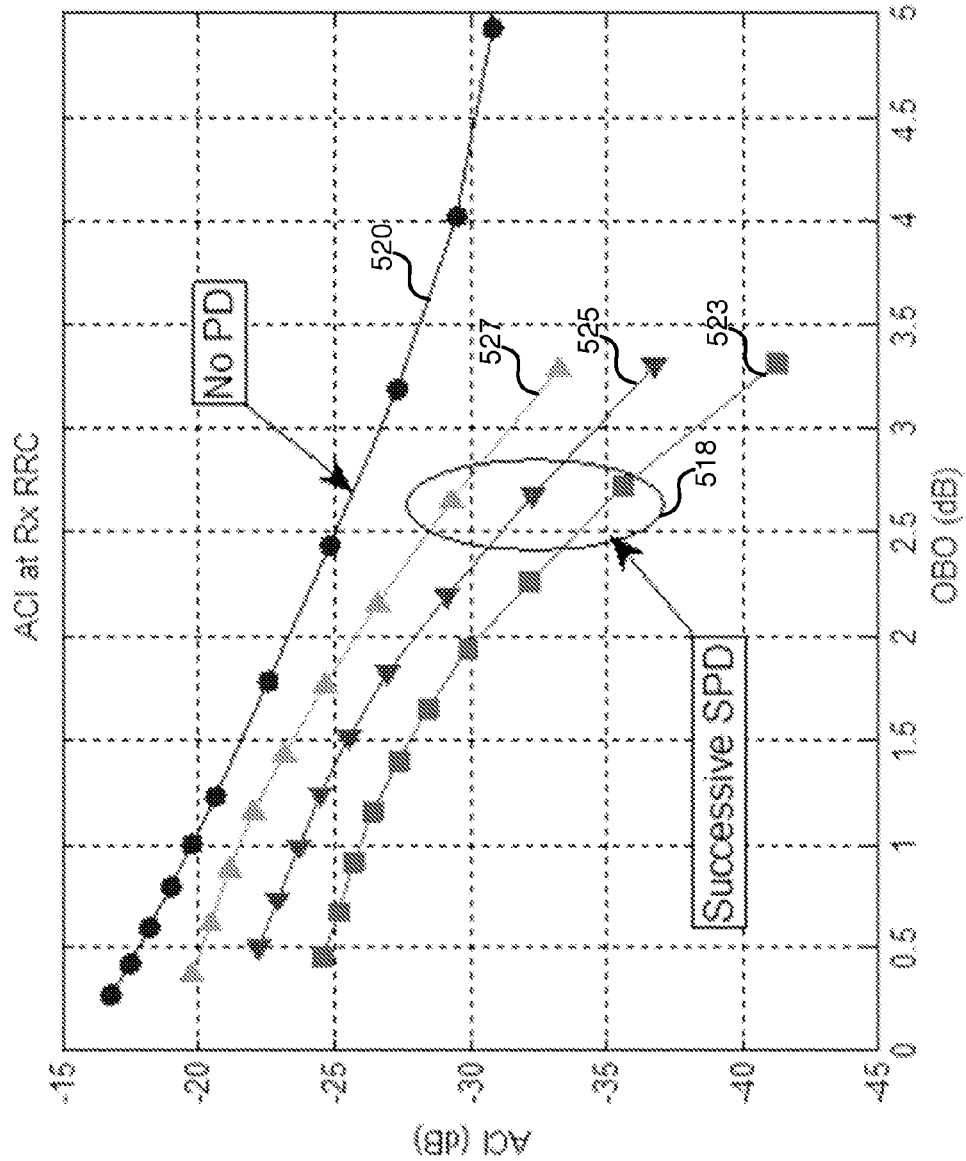
FIG. 8 shows simulation results for ACI with embodiments of the disclosed signal predistortion and without signal predistortion at receive filter output for varying levels of OBO with adjacent carrier spacing of 1.25× symbol rate.
Figure 9:
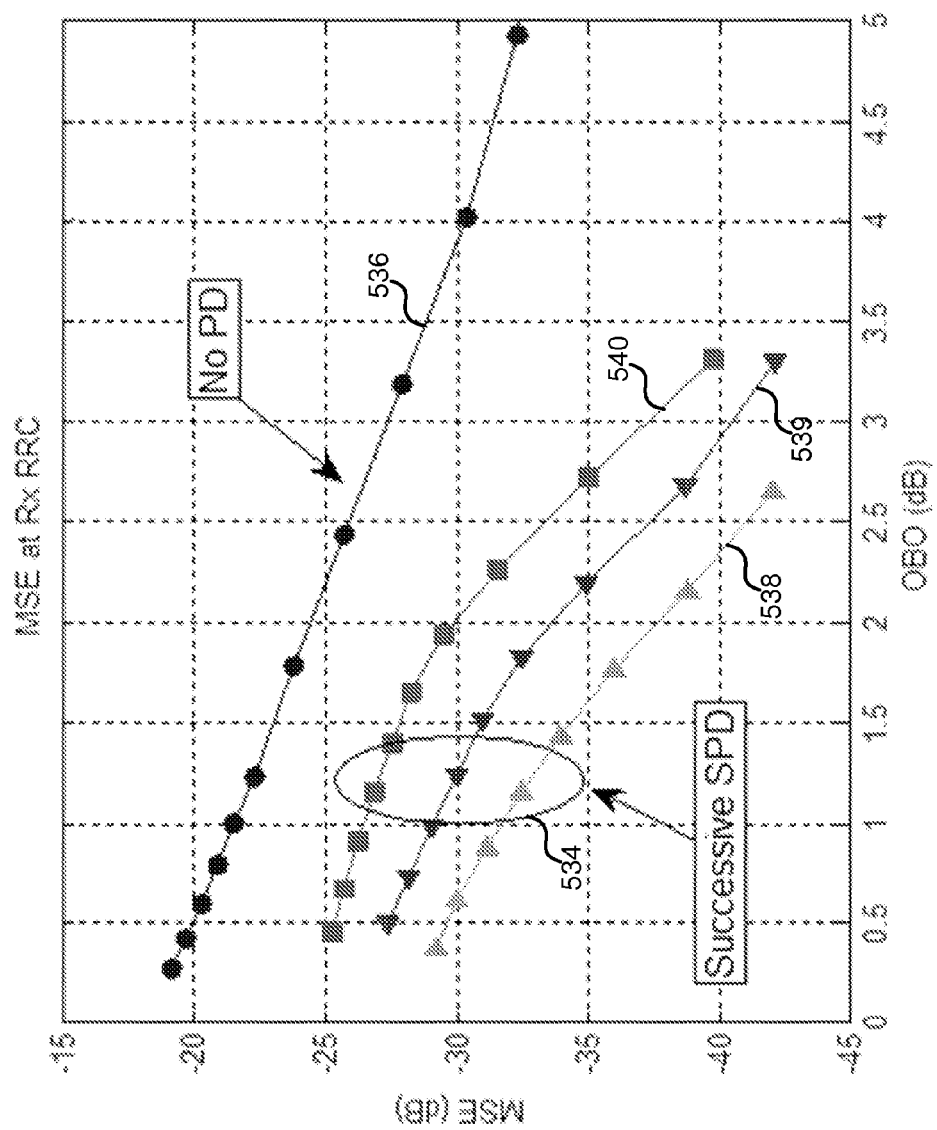
FIG. 9 is similar to FIG. 8 but shows the simulation results for MSE, instead of ACI, with embodiments of the disclosed signal predistortion and without signal predistortion at receive filter output for varying levels of OBO with adjacent carrier spacing of 1.25× symbol rate.

As noted above in the third example embodiment, scaling can be applied to each of the two error signals to adjust their relative levels. FIGS. 8 and 9 illustrate this tunability feature of embodiments of the disclosed technology. The results of this simulation illustrate that combinations of the first two example embodiments of signal predistortion offer a balance to trade-off levels of suppression of out-of-band distortion versus in-band distortion generated when nonlinear HPA is included in the system.

FIG. 8 shows simulation results for ACI with embodiments of the disclosed successive signal predistortion 518 and without signal predistortion 520 at receive filter output for varying levels of OBO with adjacent carrier spacing of 1.25× symbol rate. Curve 523 illustrates an example in which the weighting coefficient for predistortion at the amplifier, $\alpha$, is set at 1.0, and the weighting coefficient for predistortion at the receiver, $\beta$, is set at 0.0. Curve 525 illustrates an example in which the weighting coefficients for predistortion at the amplifier and at the receiver are each set at 0.5. Curve 527 illustrates an example in which the weighting coefficient for predistortion at the amplifier, $\alpha$, is set at 0.3, and the weighting coefficient for predistortion at the receiver, $\beta$, is set at 0.7.

FIG. 9 is similar to FIG. 8 but shows the simulation results for MSE, instead of ACI, with successive signal predistortion 534 and without any signal predistortion 536 at the receive filter output for varying levels of OBO with an adjacent carrier spacing of 1.25× symbol rate. Curve 538 illustrates an example in which the weighting coefficient for predistortion at the amplifier, $\alpha$, is set at 0.3, and the weighting coefficient for predistortion at the receiver, $\beta$, is set at 0.7. Curve 539 illustrates an example in which the weighting coefficients for predistortion at the amplifier and at the receiver are each set at 0.5. Curve 540 illustrates an example in which the weighting coefficient for predistortion at the amplifier, $\alpha$, is set at 1.0, and the weighting coefficient for predistortion at the receiver, $\beta$, is set at 0.0.

As these examples in FIGS. 8 and 9 illustrate, with embodiments such as that in example embodiment three, the weighting coefficients for predistortion to cancel distortion at the amplifier and to cancel distortion at the receive filter can be adjusted to attack ACI, MSE, or a combination of both.

Figure 10:
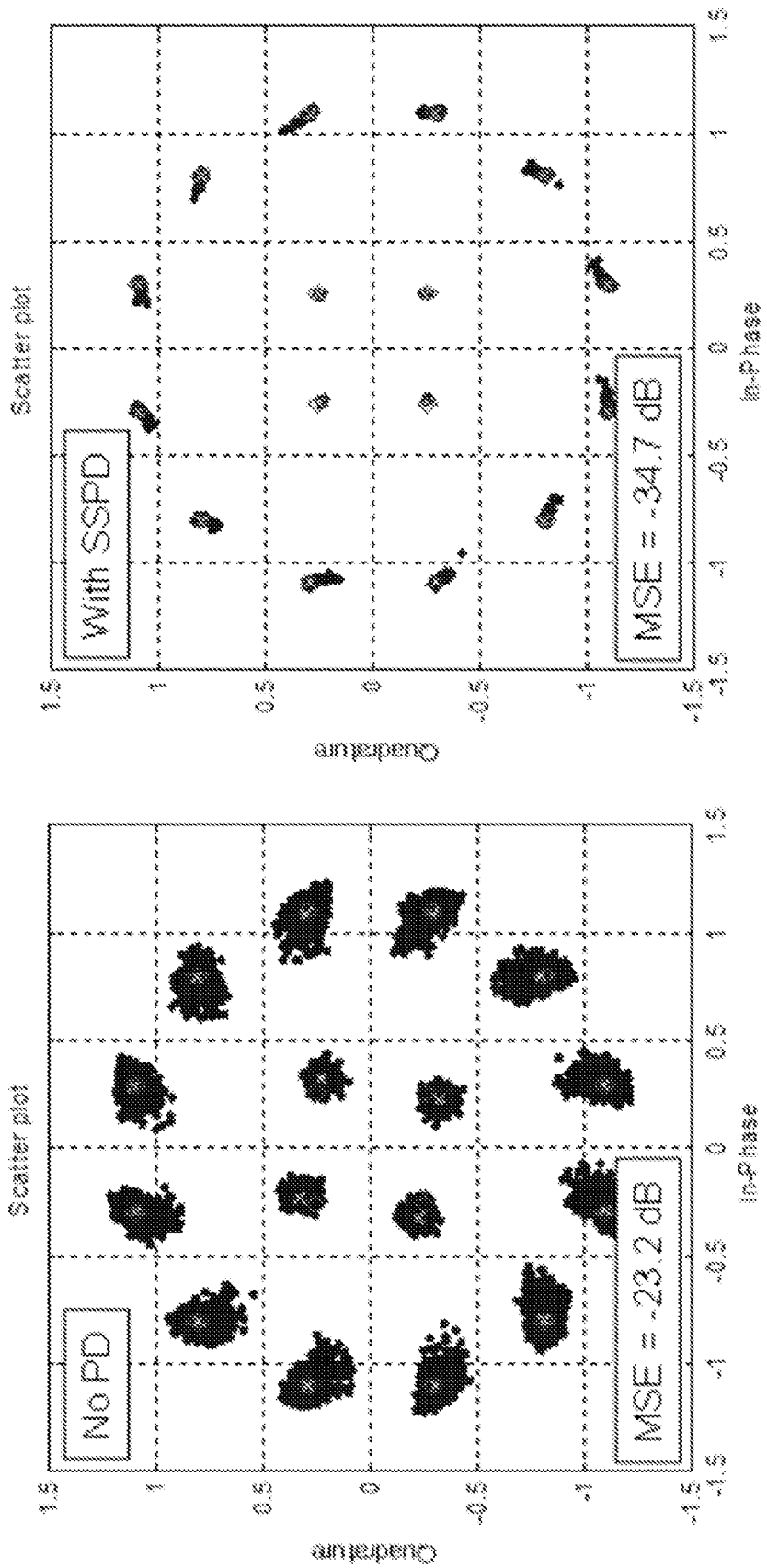
FIG. 10 displays noiseless scatter plots at the best-sampled output of receive filter for a system without predistortion (left) and with proposed signal predistortion (right) at OBO level of 1.5 dB when no adjacent carriers are present.

FIG. 10 displays noiseless scatter plots at the best-sampled output of receive filter for a system without predistortion (left) and with proposed signal predistortion (right) at OBO level of 1.5 dB when no adjacent carriers are present. As the results of this simulation illustrate, in embodiments disclosed herein proposed scheme offer a significant reduction in the clustering with close to 11.5 dB improvement in MSE, while keeping the HPA operating efficiently at the same OBO level for both cases.

Figure 11:
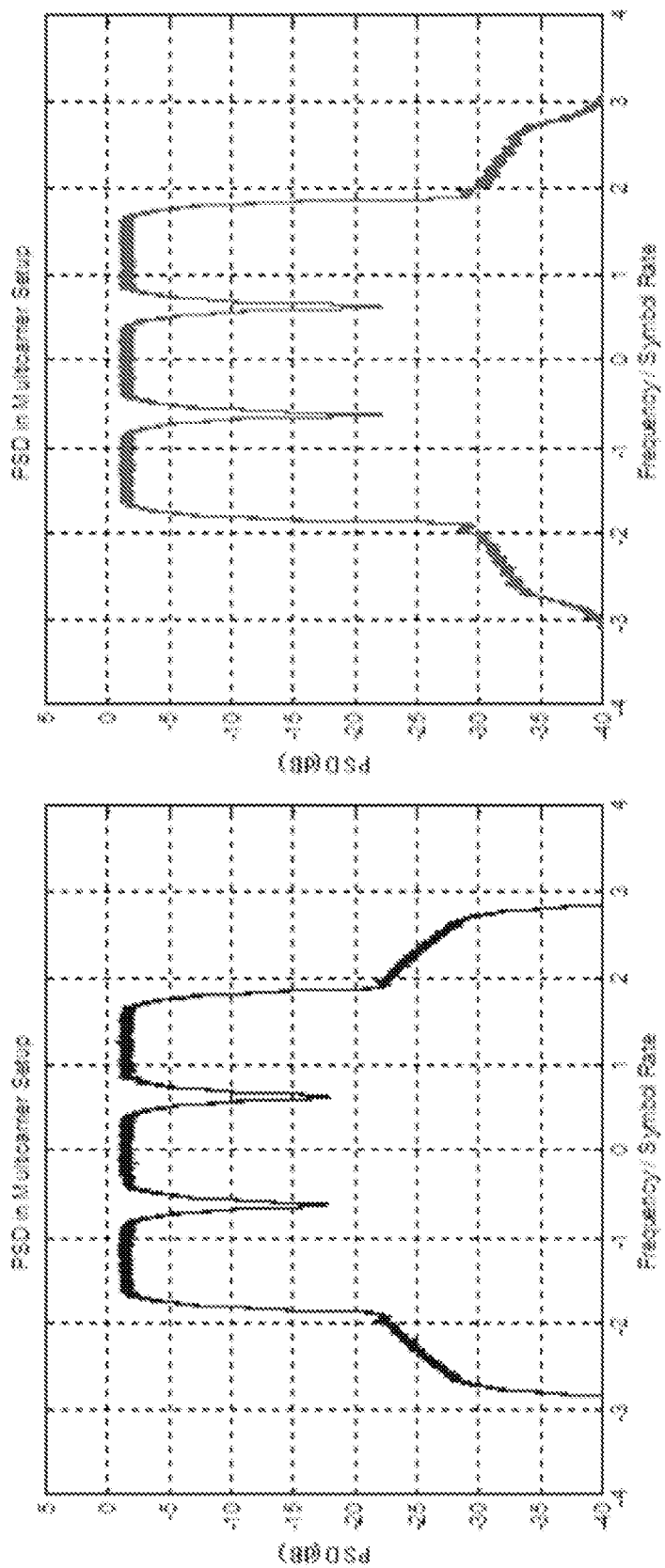
FIG. 11 displays Power Spectral Density (PSD) as would be measured at the gateway when three equal-power carriers are transmitted at adjacent carrier spacing of 1.25× symbol rate.

FIG. 11 displays Power Spectral Density (PSD) as would be measured at the gateway when three equal-power carriers are transmitted at adjacent carrier spacing of 1.25× symbol rate. Particularly the shows the PSD without signal predistortion (left) and with signal predistortion (right) at OBO level of 1.5 dB, for the three carriers, each process through its own HPA, with adjacent carrier spacing of 1.25× symbol rate. As these simulation results illustrate, there is better separation between the adjacent frequency bands where signal predistortion is implemented. This might best be seen by the deeper valley between the carriers where signal predistortion is applied (right-hand side) as compared to the carriers for which there is no signal predistortion (left-hand side).

Figure 12:
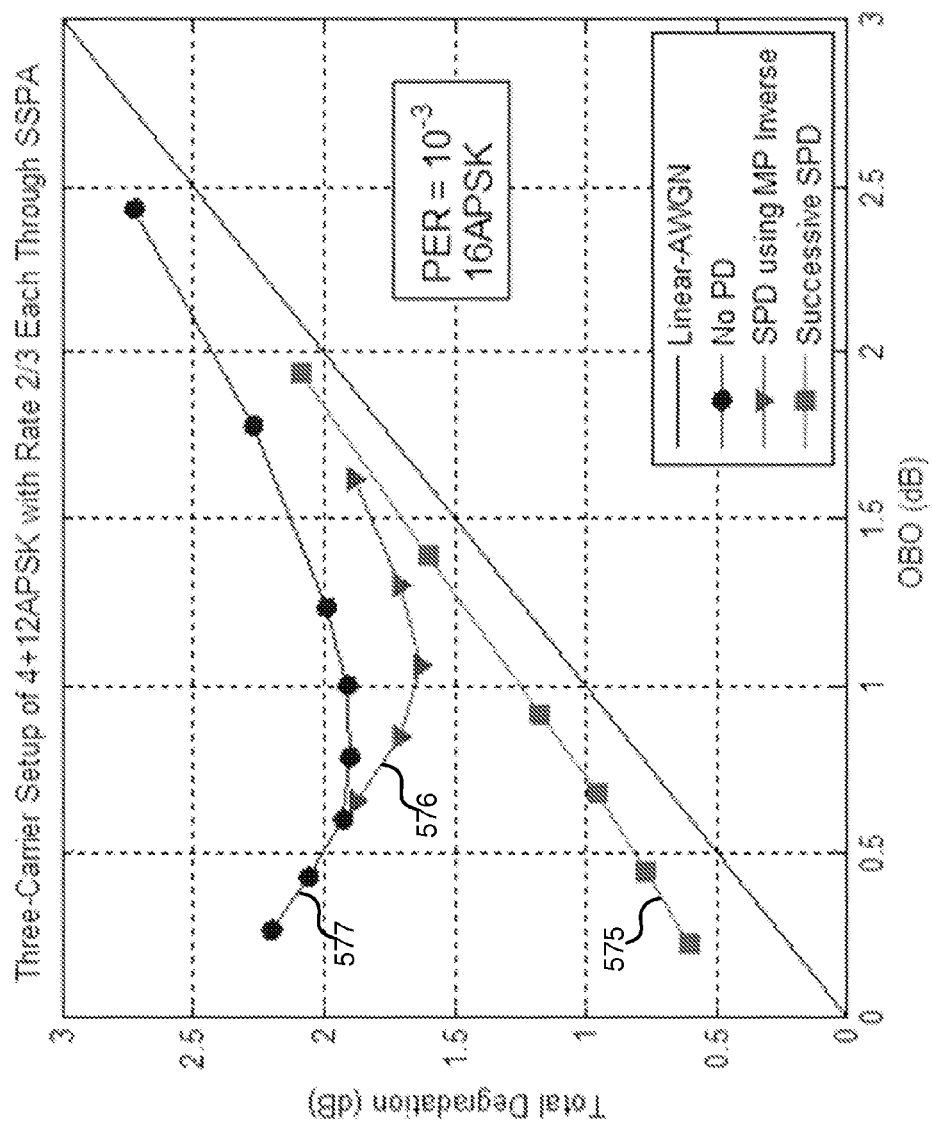
FIG. 12 quantifies performance using an LDPC code having a code rate 2/3 and codeblock length of 5760 bits at a target packet-error rate of $10^{-3}$.

FIG. 12 quantifies performance using an LDPC code having a code rate 2/3 and codeblock length of 5760 bits. The number of internal LDPC iterations in this simulation was set at 50. This figure shows the total degradation (TD) in dB relative to the ideal case of AWGN-only impairment at target coded packet error rate (PER) of $10^{-3}$.

FIG. 12 also includes a comparison with existing signal predistortion technique reported in the open literature. In particular, a signal predistortion technique was chosen for comparison that predistorts the signal by applying memory polynomial (MP) inverse in a single-stage. Three curves are shown in the results of FIG. 12, one for a system employing the successive signal predistortion 575 described in embodiments herein, a second curve for a system employing single-stage signal predistortion using memory polynomial-based inverse 576, and a third is for a system without predistortion 577. The system that uses a memory polynomial-based inverse assumes a nonlinearity of the seventh order with odd and even terms, whose coefficients are obtained using least-mean-square (LMS) adaptation based on indirect learning, with a training sequence spanning 5000 symbols. Again, adjacent carrier spacing of 1.25× symbol rate is used.

This shows that for lower levels of backoff, the successive signal predistortion according to embodiments disclosed herein provides lower levels of degradation as measured in dB as compared to applying a single-stage signal predistortion using memory polynomial-based inverse, or with no predistortion at all. This simulation indicates that the amplifier with successive signal predistortion can be pushed harder than it could otherwise be pushed without successive signal predistortion. As can be seen in the figure, the single-stage inverse-based signal predistortion performs better than the system without predistortion, yielding close to 0.3 dB improvement in TD. The proposed successive signal predistortion offers additional benefit over state-of-the-art signal predistortion using nonlinearity inverse, providing 0.9 further improvement in TD.

While various embodiments of the disclosed technology have been described above, it should be understood that they have been presented by way of example only, and not of limitation. Likewise, the various diagrams may depict an example architectural or other configuration for the disclosed technology, which is done to aid in understanding the features and functionality that can be included in the disclosed technology. The disclosed technology is not restricted to the illustrated example architectures or configurations, but the desired features can be implemented using a variety of alternative architectures and configurations. Indeed, it will be apparent to one of skill in the art how alternative functional, logical or physical partitioning and configurations can be implemented to implement the desired features of the technology disclosed herein. Also, a multitude of different constituent module names other than those depicted herein can be applied to the various partitions. Additionally, with regard to flow diagrams, operational descriptions and method claims, the order in which the steps are presented herein shall not mandate that various embodiments be implemented to perform the recited functionality in the same order unless the context dictates otherwise.

Although the disclosed technology is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the disclosed technology, whether or not such embodiments are described and whether or not such features are presented as being a part of a described embodiment. Thus, the breadth and scope of the technology disclosed herein should not be limited by any of the above-described exemplary embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, can be combined in a single package or separately maintained and can further be distributed in multiple groupings or packages or across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

What is claimed is:

1. A communication system, comprising a plurality of channels, each channel having a corresponding signal input, and each channel further comprising:

a high power amplifier comprising an input and an output; and a signal predistorter comprising an input coupled to receive an information signal comprising input samples and an output coupled to the high power amplifier, the signal predistorter configured to receive an input sample, generate a distortion sample based on an estimate of nonlinearity of the high power amplifier at an operating saturation level, modify the input sample with a correction term to generate a predistortion signal, wherein the correction term is proportional to the distortion sample, and further wherein the predistortion signal comprises the information signal modified to account for nonlinearities in the high power amplifier, wherein the signal predistorter is a multistage signal predistorter, wherein the proportionality of the correction term to the distortion sample is based on a convergence factor, and the convergence factor decreases at each subsequent stage of the multistage signal predistorter.

2. The communication system of claim 1, wherein the generated distortion sample comprises an estimate of the distortion sample at the output of the high power amplifier that is given by $$\hat{x}[k] = f_{NL}(\underline{x}_{PD}^{(s)}[k;L];\gamma_{IBO})$$

where $f_{NL}(\bullet)$ represents nonlinearity of the high power amplifier at a given level of saturation, $\underline{x}_{PD}^{(s)}[k;L]$ is the input to an $s^{th}$ stage of the multistage signal predistorter, and $\gamma_{IBO}$ is a real-valued scaling parameter to scale to a determined input back-off level.

3. A communication system, comprising a plurality of channels, each channel having a corresponding signal input, and each channel further comprising:

a high power amplifier comprising an input and an output; and a signal predistorter comprising an input coupled to receive an information signal comprising input samples and an output coupled to the high power amplifier, the signal predistorter configured to receive an input sample, generate a distortion sample based on an estimate of nonlinearity of the high power amplifier at an operating saturation level, modify the input sample with a correction term to generate a predistortion signal, wherein the correction term is proportional to the distortion sample, and further wherein the predistortion signal comprises the information signal modified to account for nonlinearities in the high power amplifier, wherein the signal predistorter is a multistage signal predistorter, and further wherein the predistortion signal output by an $(s+1)^{th}$ stage of the multistage signal predistorter comprises $$x_{PD}^{(s+1)}[k]=x_{PD}^{(s)}[k]+\mu_1^{(s)}\cdot e_{PA}[k]$$

where $\mu_1^{(s)}$ is a step-size sequence that is positive and decreases, $e_{PA}[k]$ is the distortion sample and $x_{PD}^{(s)}[k]$ is an output from an $s^{th}$ stage of the multistage signal predistorter.

4. The communication system of claim 1, wherein for a first stage of the multistage signal predistorter, the input sample comprises undistorted input samples prior to amplification by the high power amplifier and the predistortion signal is a first predistortion signal output by the first stage.

5. A communication system, comprising a plurality of channels, each channel having a corresponding signal input, and each channel further comprising:
a high power amplifier comprising an input and an output; and
a signal predistorter comprising an input coupled to receive an information signal comprising input samples and an output coupled to the high power amplifier, the signal predistorter configured to receive an input sample, generate a distortion sample based on an estimate of nonlinearity of the high power amplifier at an operating saturation level, modify the input sample with a correction term to generate a predistortion signal, wherein the correction term is proportional to the distortion sample, and further wherein the predistortion signal comprises the information signal modified to account for nonlinearities in the high power amplifier,
wherein the signal predistorter is a multistage signal predistorter, wherein for a first stage of the multistage signal predistorter, the input sample comprises undistorted input samples prior to amplification by the high power amplifier and the predistortion signal is a first predistortion signal output by the first stage, and
wherein for each $s^{th}$ stage of the multistage signal predistorter after the first stage, the input sample comprises the predistortion signal generated by the $(s-1)^{th}$ stage of the multistage signal predistorter.

6. The communication system of claim 5, wherein the correction term for each $s^{th}$ stage of the multistage signal predistorter after the first stage is smaller than the correction term applied at the $(s-1)^{th}$ stage of the multistage signal predistorter.

7. The communication system of claim 6, wherein the number of stages and the correction term for each stage are chosen such that the correction applied by the multistage signal predistorter converges.

8. The communication system of claim 1, wherein the signal predistorter is further configured to apply a scaling parameter to the estimate of nonlinearity of the high power amplifier before generating the distortion sample.

9. The communication system of claim 8, wherein the scaling parameter is chosen based on a determined operating point of the high power amplifier.

10. The communication system of claim 1, wherein the signal predistorter is further configured to determine the estimate of nonlinearity of the high power amplifier based on known operating characteristics of the high power amplifier operating at a determined level of saturation.

11. The communication system of claim 1, wherein input samples comprise a vector of complex-valued samples.

12. The communication system of claim 1, wherein the information signal comprises multiple samples per symbol.

13. A communication system, comprising a plurality of channels, each channel having a corresponding signal input, and each channel further comprising:
a high power amplifier comprising an input and an output; and
a first signal predistorter comprising an input coupled to receive an information signal comprising input samples and an output coupled to the high power amplifier, the signal predistorter configured to receive an input sample, generate a distortion sample based on an estimate of nonlinearity of the high power amplifier at an operating saturation level, modify the input sample with a correction term to generate a predistortion signal, wherein the correction term is proportional to the distortion sample, and further wherein the predistortion signal comprises the information signal modified to account for nonlinearities in the high power amplifier, and
a second signal predistorter, the second signal predistorter comprising an input coupled to receive an information signal and an output, the second signal predistorter configured to receive a sample from the information signal, generate a receiver distortion sample based on an estimate of nonlinearity caused by the high power amplifier that would appear at a receiver in communication with a transmitter, modify the received sample with a second correction term to generate a receiver predistortion signal, wherein the second correction term is proportional to the receiver distortion sample, and further wherein the receiver predistortion signal comprises the information signal modified to account for nonlinearities caused by the high power amplifier that would appear at the receiver.

14. The communication system of claim 13, wherein the first and second signal predistorters are applied in the communication system as a weighted combination.

15. The communication system of claim 1, wherein the estimate of nonlinearity of the high power amplifier comprises an adaptively estimated model of the non-linearity of the high power amplifier.

16. In a communication system comprising a high power amplifier, a multistage signal predistorter comprising a plurality of stages, the multistage signal predistorter comprising:
an input coupled to receive an input sample;
a nonlinear estimator configured to estimate a nonlinearity of the high power amplifier at an operating saturation level;
a first adder configured to subtract the determined estimate from an input information signal to generate a distortion sample;
a multiplier configured to multiply the distortion sample by a convergence factor to generate a correction term, wherein the convergence factor decreases at each subsequent stage of the plurality of stages;
a second adder configured to add the correction term to the input information signal to generate a predistortion signal.

17. The multistage signal predistorter of claim 16, wherein each $s^{th}$ stage comprises:
a first adder configured to subtract the determined estimate from an input information signal at the $s^{th}$ stage to generate an $s^{th}$ distortion sample;

a multiplier configured to multiply the $s^{th}$ distortion sample by an $s^{th}$ convergence factor to generate an $s^{th}$ correction term;

a second adder configured to add the $s^{th}$ correction term to the input information signal at the $s^{th}$ stage to generate an $s^{th}$ predistortion signal; and an output coupled to the high power amplifier and configured to output the $s^{th}$ predistortion signal from a last stage of the plurality of stages.

18. The signal predistorter of claim 16, wherein for a first stage of the multistage signal predistorter, the input information signal comprises an undistorted information signal.

19. The multistage signal predistorter of claim 18, wherein for each $s^{th}$ stage of the multistage signal predistorter after the first stage, the input information signal comprises the predistortion signal generated by the $(s-1)^{th}$ stage of the multistage signal predistorter.

20. The multistage signal predistorter of claim 19, wherein the correction term for each $s^{th}$ stage of the multistage signal predistorter after the first stage is smaller than the correction term applied at the $(s-1)^{th}$ stage of the multistage signal predistorter.

21. The multistage signal predistorter of claim 20, wherein the number of stages and the correction term for each stage are chosen such that the correction applied by the multistage signal predistorter converges.

22. In a communication system, a method of signal predistortion comprising:

receiving an input sample of an information signal at an input to an $s^{th}$ stage of a multistage signal predistorter;

the $s^{th}$ stage of the multistage signal predistorter generating a distortion sample based on an estimate of nonlinearity of a high power amplifier at an operating saturation level, and the $s^{th}$ stage of the multistage signal predistorter modifying the input sample with a correction term to generate a predistortion signal wherein the correction term is proportional to the distortion sample, and further wherein the predistortion signal comprises the information signal modified to account for nonlinearities in the high power amplifier, wherein the proportionality of the correction term to the distortion sample is based on a convergence factor, and the convergence factor decreases at each subsequent stage of the multistage signal predistorter.

23. The method of claim 22, wherein for a first stage of the multistage signal predistorter, the input sample comprises input samples prior to amplification by the high power amplifier and the predistortion signal is a first predistortion signal output by the first stage.

24. The method of claim 23, wherein for each $s^{th}$ stage of the multistage signal predistorter after the first stage, the input sample comprises the predistortion signal generated by the $(s-1)^{th}$ stage of the multistage signal predistorter.

25. The method of claim 24, wherein the correction term for each $s^{th}$ stage of the multistage signal predistorter after the first stage is smaller than the correction term applied at the $(s-1)^{th}$ stage of the multistage signal predistorter.

26. The method of claim 25, wherein the correction term decreases as a function of $1/n$, where n is the number of stages of the multistage signal predistorter.

27. The method of claim 25, wherein the number of stages and the correction term for each stage are chosen such that the correction applied by the multistage signal predistorter converges.

28. The method of claim 22, further comprising applying a scaling parameter to the estimate of nonlinearity of the high power amplifier before generating the distortion sample.

29. The method of claim 28, wherein the scaling parameter is chosen based on a determined operating point of the high power amplifier.

30. The method of claim 22, wherein modifying the input sample with a correction term comprises subtracting the distortion sample from the undistorted signal.

31. The method of claim 22, wherein the correction term is equal to the distortion sample.

32. The method of claim 22, wherein the signal predistorter is further configured to determine the estimate of nonlinearity of the high power amplifier based on known operating characteristics of the high power amplifier operating at a determined level of saturation.

33. The method of claim 22, wherein the input samples comprise a vector of complex-valued samples.

34. The method of claim 22, wherein the information signal comprises multiple samples per symbol.

35. In a communication system, a method of signal predistortion comprising:

receiving an input sample from an information signal at an input of a first signal predistorter;

the first signal predistorter generating a distortion sample based on an estimate of nonlinearity of a high power amplifier at an operating saturation level;

the first signal predistorter modifying the input sample with a correction term to generate a predistortion signal, wherein the correction term is proportional to the distortion sample, and further wherein the predistortion signal comprises the information signal modified to account for nonlinearities in the high power amplifier; and a second signal predistorter receiving a sample from the information signal, generating a receiver distortion sample based on an estimate of nonlinearity of the power amplifier that would be experienced at a receiver, modifying the received sample with a second correction term to generate a receiver predistortion signal, wherein the second correction term is proportional to the receiver distortion sample, and further wherein the receiver predistortion signal comprises the information signal modified to account for nonlinearities in the high power amplifier.

36. The method of claim 35, wherein the first and second signal predistorters are applied in the communication system as a weighted combination.

37. The method of claim 22, wherein the generated distortion sample comprises an estimate of the distorted sample at the output of the high power amplifier that is given by $$\hat{x}_{PA}[k] = f_{NL}(\underline{x}_{PD}^{(s)}[k;L]; \gamma_{IBO})$$

where $f_{NL}(\cdot)$ represents nonlinearity of the high power amplifier at a given level of saturation, $\underline{x}_{PD}^{(s)}[k;L]$ is the input to an $s^{th}$ stage of the multistage signal predistorter, and $\gamma_{IBO}$ is a real-valued scaling parameter to scale to a determined input back-off level.

38. In a communication system, a method of signal predistortion comprising:

receiving an input sample of an information signal at an input to an $s^{th}$ stage of a multistage signal predistorter;

the $s^{th}$ stage of the multistage signal predistorter generating a distortion sample based on an estimate of nonlinearity of a high power amplifier at an operating saturation level, and the $s^{th}$ stage of the multistage signal predistorter modifying the input sample with a correction term to generate a predistortion signal wherein the correction term is proportional to the distortion sample, and further wherein the predistortion signal comprises the information signal modified to account for nonlinearities in the high power amplifier, wherein the predistortion signal output by an $(s+1)^{th}$ stage of the multistage signal predistorter comprises $$x_{PD}^{(s+1)}[k] = x_{PD}^{(s)}[k] + \mu_1^{(s)} \cdot e_{PA}[k]$$

where $\mu_1^{(s)}$ is a step-size sequence that is positive and decreases, $e_{PA}[k]$ is the distortion sample and $x_{PD}^{(s)}[k]$ is an output from an $s^{th}$ stage of the multistage signal predistorter.

\* \* \* \* \*